United States Patent [19]

Adams et al.

[11] Patent Number: 5,786,778
[45] Date of Patent: Jul. 28, 1998

[54] VARIABLE SAMPLE-RATE DAC/ADC/ CONVERTER SYSTEM

[75] Inventors: Robert W. Adams, Acton, Mass.; Tom W. Kwan, Milpitas, Calif.

[73] Assignee: Analog Devices, Inc., Norwood, Mass.

[21] Appl. No.: 539,438

[22] Filed: Oct. 5, 1995

[51] Int. Cl.[6] .................................................. H03M 1/66
[52] U.S. Cl. .................................. 341/61; 364/724.1
[58] Field of Search .......................... 341/61, 143, 144; 364/724.1

[56] References Cited

U.S. PATENT DOCUMENTS

| | | | |
|---|---|---|---|
| 4,965,531 | 10/1990 | Riley | 331/1 A |
| 5,055,802 | 10/1991 | Hietala et al. | 331/16 |
| 5,420,892 | 5/1995 | Okamoto | 375/350 |
| 5,485,512 | 1/1996 | Wilson et al. | 341/143 |
| 5,489,903 | 2/1996 | Wilson et al. | 341/144 |
| 5,512,897 | 4/1996 | Wilson et al. | 341/144 |

FOREIGN PATENT DOCUMENTS

| | | | |
|---|---|---|---|
| 0 429 217 A2 | 11/1990 | European Pat. Off. | H03L 7/197 |
| WO 95/08221 | 3/1995 | WIPO | H03M 1/66 |

OTHER PUBLICATIONS

Multirate Filter Designs Using Comb Filters Shuni Chu, IEEE Trans. Circuits and Sys. Nov. 1994, vol. CAS-31 pp. 913-924.

*Primary Examiner*—Fritz Fleming
*Assistant Examiner*—Peguy JeanPierre
*Attorney, Agent, or Firm*—Wolf, Greenfield & Sacks, P.C.

[57] ABSTRACT

A digital oversampling noise-shaping system includes a digital noise-shaped clock signal generating circuit, including a DCO operating at a fixed master clock rate, that receives a digital input sample clock signal having an input sample rate and produces a noise-shaped clock signal having a variable rate with an average rate equal to a multiple of the input sample rate. In one embodiment, an interpolator is coupled to the clock signal generating circuit and receives the digital input samples at an input sample rate and, responsive to the noise-shaped clock signal, upsamples the digital input samples at the variable rate. A hold circuit repeats the interpolated samples at the master clock rate. A digital noise-shaping circuit, coupled to the hold circuit, performs digital noise-shaping on the repeated samples received from the hold circuit. In another embodiment, a decimator is coupled to the clock signal generating circuit. Digital input samples having an input sample rate are latched to the input of the decimator at a rate controlled by the noise-shaped clock signal. The clock signal generating circuit includes a PLL in one embodiment. The digital noise-shaping circuit, in one embodiment, includes sigma-delta modulator in which the downstream one of first and second integrators operates at a reduced multiple of a fixed master clock rate.

18 Claims, 10 Drawing Sheets

VARIABLE SAMPLE-RATE DAC/ADC/ CONVERTER SYSTEM

FIELD OF THE INVENTION

The present invention relates generally to methods and circuits for performing oversampling digital-to-analog or analog-to-digital or all digital sample rate signal conversion. More particularly, the present invention relates to a method and circuit for performing digital-to-analog signal conversion using continuously variable digital interpolation or analog-to-digital conversion using decimation.

BACKGROUND OF THE INVENTION

Sigma-delta digital-to-analog converters ("DACs") and analog-to-digital converters ("ADCs") recently have come into widespread use with the development of suitable process technology and the increase in digital audio and other applications. Sigma-delta converters utilize oversampling techniques (i.e., sampling at rates greater than the Nyquist rate) to achieve high signal-to-noise ratios. Such converters also exhibit excellent linearity. Additionally, sigma-delta converters are relatively straight-forward and inexpensive to implement due to their simplicity.

Sigma-delta DACs commonly include a front-end interpolator which receives digital input samples and increases the sampling rate (typically 64–256 times the input sample rate) of the digital input samples. A sigma-delta modulator receives the higher frequency input samples from the interpolator and converts the samples to a lower accuracy (typical one-bit), high frequency bit stream. Additionally, the sigma-delta modulator performs an oversampling technique referred to as "noise shaping". "Noise shaping" is a technique by which the noise spectrum of the input samples is manipulated such that a major component of the quantization noise power is shifted to a frequency range higher than the upper frequency limit of the band of interest, which is typically the signal bandwidth. The one-bit data stream output by the modulator is converted to an analog signal by a conventional DAC and subsequent filtering is performed in the analog domain to reduce the high frequency quantization noise component of the analog output signal. Sigma-delta converters are described, for example, in Mixed-Signal Design Seminar, published by Analog Devices, Inc. (the assignee of the present application), Norwood, Mass., 1991, which reference is incorporated herein by reference.

FIG. 1 is a block diagram showing a typical one-bit prior art sigma-delta DAC system. The system includes an up-sample interpolator element 12, a digital low pass filter 16, a sigma-delta modulator 20, a one-bit DAC 24 and an analog low pass filter 28. Digital input samples are received on n-bit input bus 10 and provided to up-sample element 12. The digital input samples can be any number n of bits and can have any input sample rate. For example, a typical compact disc player application includes 16-bit digital input samples having an input sample rate of 44.1 kHz. Up-sample element 12 increases the input sample rate of the digital input samples by a factor of Z, typically 64–256. Z is referred to as an "interpolation ratio" or "up-sampling factor". The up-sampled digital input samples are provided on n-bit bus 14 to digital low pass filter 16 which filters the up-sampled digital input samples. Filter 16 filters out images between a baseband frequency and the up-sampled sampling rate. Those skilled in the art will understand that while up-sample element 12 and low pass filter 16 are shown as separate elements, those elements typically are practically implemented with a single element interpolation filter.

The filtered digital samples are provided on n-bit bus 18 to sigma-delta modulator 20. Sigma-delta modulator 20 modulates the received digital samples at an "oversampling rate" (equal to the up-sampled rate of the digital samples) and outputs a one-bit digital stream on one-bit bus 22. While the sigma-delta modulator 20 is shown and described herein as a one-bit modulator, those skilled in the art will appreciate that modulators greater than one-bit are available and are used depending on accuracy requirements. The sigma-delta modulator 20 conventionally performs noise-shaping on the digital samples providing a one-bit output stream essentially having a low-frequency signal component and a high-frequency quantization noise component.

The one-bit data stream is provided on bus 22 to one-bit DAC 24 which conventionally converts the data stream into an analog output signal on line 26. The analog output signal is provided on line 26 to low pass filter 28 (typically, an analog switched-capacitor filter) which conventionally reduces the high frequency quantization noise component of the signal. As will be understood by those skilled in the art, low pass filter 28 does not actually eliminate the quantization noise, but simply reduces it to acceptable levels to suit a particular application (i.e., so that the signal can subsequently be handled by other components such as loudspeakers, etc.). Complete elimination of the quantization noise is not necessary, for example, in a compact disc player application, because the quantization noise substantially resides above the audible range (i.e., above 20 kHz).

A limitation of conventional DACs, including the typical sigma-delta DAC shown in FIG. 1, is that they determine the magnitude of the input samples only at equally spaced temporal intervals. Such a process is known as uniform sampling. Additionally, with conventional DACs, the digital input sample rate is not made independent of the master clock signal used for clocking the sigma delta modulator. The input sample rate must be some integer division of the master clock signal. Consequently, if an application requires two different digital input sample rates, at least one of which is not divisible into the master clock signal, for example, then two master clock signals (having different frequencies) are required for clocking the sigma-delta modulator.

The benefits of oversampling converters, such as sigma-delta DACs, are well-known in the art. Such benefits include freedom from distortion at low signal levels, linear-phase anti-alias filtering, and compatibility with CMOS processes. As mentioned, however, one drawback of oversampling converters is that they typically require a high-frequency master clock that is a simple binary multiple of the input sampling rate. Commonly, the master clock rate of such converters is 256 or 512 times the input sampling rate. In many systems which utilize oversampling converters, such a high-frequency master clock is not readily available and must be generated using an external phase-locked loop ("PLL") which is "locked" to a multiple (i.e., 256 times) of the input sampling rate.

An example of such a system includes a conventional set-top box system as shown in FIG. 2. This system includes an interface and PLL block 34, an MPEG decoder 38, a DAC 48 and an analog PLL 50. The interface and PLL block 34 is designed to receive digital audio and video samples in compressed form on input bus 32. The interface 34 recovers a 27 MHZ clock signal from the incoming data samples which clock signal is related to the video frame rate and audio sample rate through ratios of integers. The 27 MHZ clock signal is provided to the MPEG decoder 38 on line 40 while the digital input data is provided to the MPEG decoder on bus 36. The MPEG decoder provides data, clock signal BCLK and input sample rate clock signal $F_s$ to the DAC 48 respectively on lines 42, 44 and 46.

The relationship between the 27 MHZ clock signal and a multiple of the audio sample rate (e.g., 256 times the audio sample rate) is complex and therefore requires an analog PLL 50 to generate the clock signal (in this example, 256 times $F_s$) from the audio sample rate clock signal $F_s$. This clock signal is provided on line 52 to the DAC. The DAC provides an analog output signal on output line 54. In addition to requiring an analog PLL to generate the clock signal for clocking the DAC, commonly, several sample rates must be supported. Therefore, systems must be designed to include hardware for preventing the generation of an audible click when the system switches between such sample rates.

An object of the present invention is to provide an improved digital oversampling converter system.

SUMMARY OF THE INVENTION

The present invention provides a method and circuit for performing continuously variable rate interpolation or continuously variable rate decimation. The invention enables the use of a fixed master clock having a frequency that is unrelated to the samples (in the case of continuously variable decimation). The circuit and method eliminates the need for an external analog PLL in systems where multiple sample rates must be supported and also allows jitter to be more effectively filtered because the cutoff frequency of a digital PLL can be much lower than that of an analog PLL. The circuit and method employs noise-shaping modulation of time intervals in the generation of a variable sampling clock signal.

In one embodiment of the invention, a digital oversampling noise-shaping system includes a digital noise-shaped clock signal generating circuit, including a digitally-controlled oscillator ("DCO"), operating at a fixed master clock rate, that receives an input sample clock signal having an input sample rate and produces a noise-shaped clock signal having a "variable rate" (instantaneously variable) with an average rate equal to an integer multiple of the input sample rate. The system additionally includes an interpolator, coupled to the clock signal generating circuit, that receives the digital input samples at an input sample rate and, responsive to the noise-shaped clock signal, produces interpolated output samples at the variable rate. The system also includes a sample hold circuit that repeats the interpolated samples at the master clock rate resulting in a net interpolation factor that is continuously variable. The system also includes a digital noise-shaping circuit, coupled to the hold circuit, that performs digital noise-shaping on the repeated samples received from the hold circuit.

The clock signal generating circuit, in this embodiment, includes a digital PLL. Also, in this embodiment, the digital noise-shaping circuit includes a sigma-delta modulator. The sigma-delta modulator includes at least first and second integrators connected in cascade. The first integrator operates at the fixed master clock rate and the second integrator operates at a reduced integer sub-multiple of the fixed master clock rate, which performs decimation from the first integrator to the second integrator.

The present invention also includes a method of upsampling and noise-shaping digital input samples. The method includes the steps of: receiving a digital input sample clock signal having an input sample rate; producing a noise-shaped clock signal having a variable rate with an average rate equal to a multiple of the input sample rate; responsive to the noise-shaped clock signal, interpolating the digital input samples at the variable rate; repeating the interpolated data at the master clock rate; and performing digital noise-shaping on the resulting samples at the master clock frequency.

In one embodiment, the step of performing digital noise-shaping includes the step of performing digital noise-shaping at at least one fixed rate. In this embodiment, the step of performing digital noise-shaping includes a first step of integrating at a fixed rate and a second step of integrating at a reduced sub-multiple of the fixed rate, which includes decimating from the first to the second steps.

The invention also includes a digital decimation system. The digital decimation system includes a digital noise-shaped clock signal generating circuit, including a DCO operating at a fixed master clock rate, that receives an input clock signal having an output sample rate and produces a noise-shaped clock signal having a variable rate with an average rate equal to a multiple of the output sample rate. The system also includes a resampler, coupled to the clock signal generating circuit, that resamples oversampled input samples at the variable rate. A decimator, coupled to the clock signal generating circuit, receives the resampled input samples and produces output samples at a rate that is fixed sub-multiple of the variable rate.

The features and advantages of the present invention will be more readily understood and apparent from the following detailed description of the invention, which should be read in conjunction with the accompanying drawings and from the claims which are appended to the end of the detailed description.

DETAILED DESCRIPTION

Figure 1:
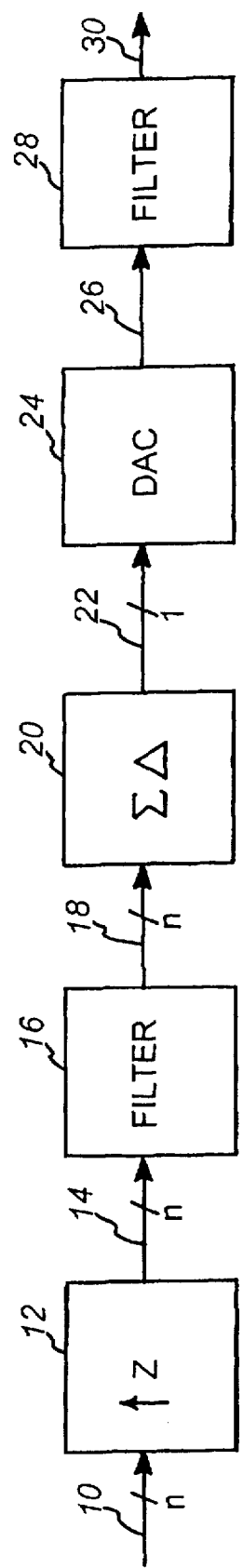
FIG. 1 is a block diagram of a conventional sigma-delta DAC system.
Figure 2:
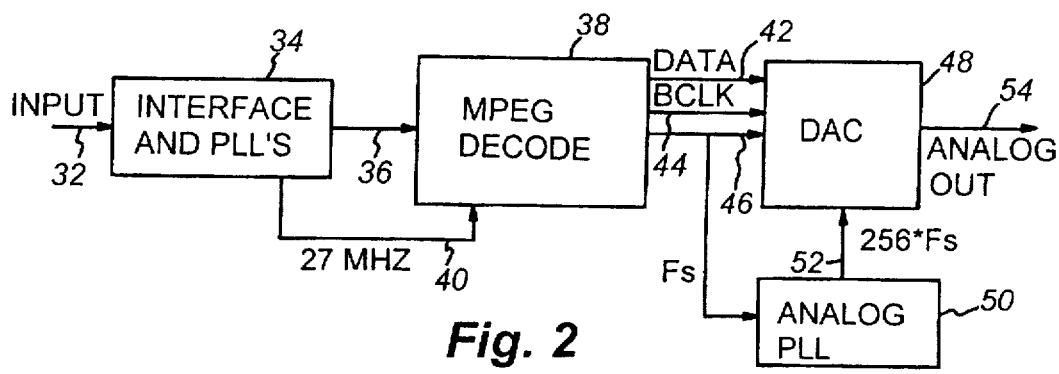
FIG. 2 is a block diagram of a conventional set-top cable box system including a conventional oversampling DAC.
Figure 3:
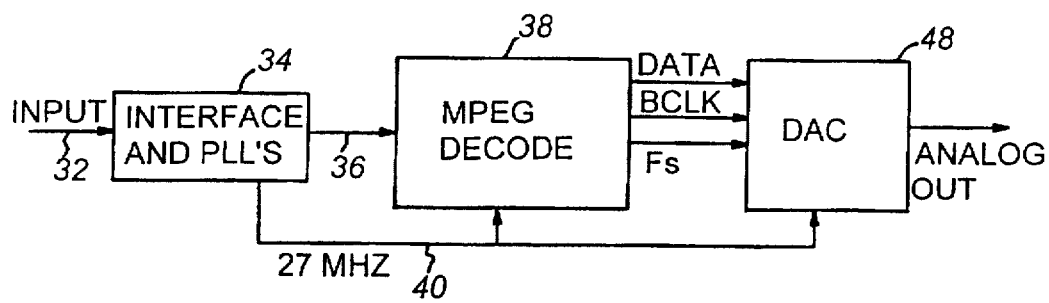
FIG. 3 is a block diagram of a set-top cable box system according to the present invention including a continuously variable rate oversampling DAC.

FIG. 3 is a block diagram of an oversampling DAC set-top box system according to the present invention. In FIG. 3, like elements are referred to by identical reference characters to those in FIG. 2. By contrast with the prior art DAC system shown in FIG. 2, the system of the present invention employs continuously variable rate interpolation and eliminates the need for the analog PLL 50. In the system of the present invention, because continuously variable rate interpolation is employed, the need for supplying a clock signal at a rate of 256 times $F_s$ is eliminated. Rather, the fixed-frequency 27 MHZ master clock is used to clock the interpolation filter of the DAC system, which clock is readily available in such set-top box systems.

Described below in more detail is the variable sample rate system of the present invention including a description of the theory and operation of a circuit for producing the variable rate clock signal. The continuously variable rate interpolation/decimation circuits described can be used, for examples, in DAC systems, ADC systems or sample rate converter systems.

Figure 4:
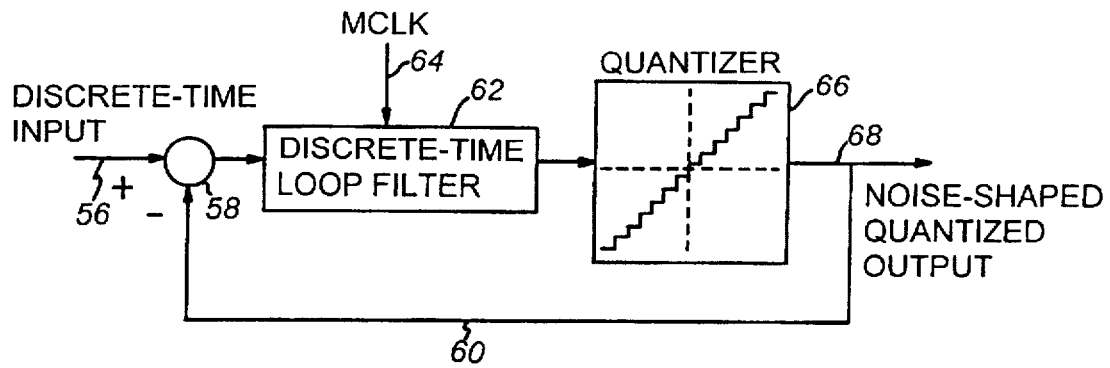
FIG. 4 is a block diagram of a conventional amplitude noise-shaping system with multi-bit quantization.

FIG. 4 is a partial block, partial schematic diagram showing a conventional digital noise-shaping loop circuit including a multi-bit quantizer. The digital noise-shaper includes a digital subtractor 58, a discrete-time loop filter 62 and a multi-bit quantizer 66. Received on input bus 56 to adder 58 are high-precision oversampled input samples. The circuit produces, on output bus 68, lower-precision (lesser number of bits) output samples at the oversampling rate. Adder 58 subtracts output samples received on bus 60 and provides the difference to the discrete-time loop filter 62, which operates at a master clock rate. Master clock signal $M_{clk}$ is received on line 64.

The discrete-time loop filter has high gain at low frequencies. The filtered signal is provided to quantizer 66 which provides a low precision output having less noise at lower frequencies. Thus, the noise-shaped output signal is a low-precision, oversampled signal having a noise power spectrum with quantization noise shifted to a high frequency range. Oversampling converters that use noise-shaping techniques generally employ a filter located downstream of the noise-shaping loop to reduce the high frequency quantization noise component of desired output signals.

Figure 5:
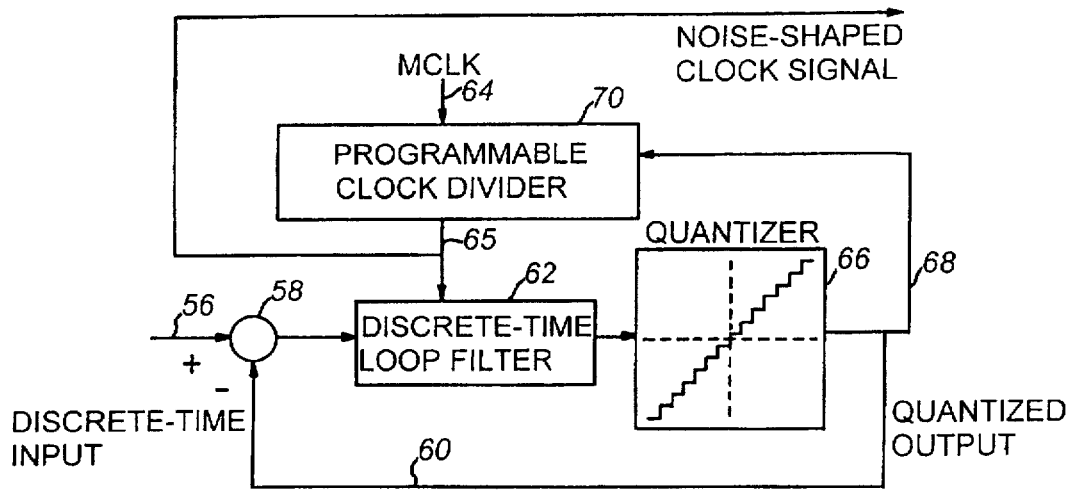
FIG. 5 is a block diagram of a noise-shaped clock generator circuit according to the present invention.

FIG. 5 is a part schematic, part block diagram of a digital noise-shaped clock signal generator circuit according to the present invention. Like elements in FIG. 5 are referred to by identical reference characters to those in FIG. 4. The circuit of FIG. 5 is similar to that of FIG. 4 except that the clock signal for clocking the discrete-time loop filter 62 is derived from a programmable clock divider (pulse-counter) 70. The programmable clock divider 70 receives the master clock signal $M_{clk}$ on line 64 and produces a clock signal on line 65 for clocking the discrete-time loop filter 62. The programmable clock divider 70 produces a clock signal on line 65 that can be a reduced fraction of the input master clock signal $M_{clk}$. The programmable clock divider 70 receives, on bus 68, the noise-shaped quantized output samples of the loop filter. The noise-shaped quantized output controls the delay between adjacent clock signals that the programmable clock divider 70 will output on line 65. In other words, the divider will wait for a certain number of master clock signals before producing an output clock signal depending on the magnitude of the digital output received from the loop filter.

The operation of the programmable clock divider is best explained by the following simple example. If the quantizer 66 is a 4-bit quantizer, then the quantizer can produce a digital output ranging from 0–15. If the quantizer output is 5, which output will be received by the programmable clock divider on bus 68, then the programmable clock divider will count 5 master clock cycles from the most recently produced clock signal before producing another clock signal on line 65. When such a clock signal is received by the discrete-time loop filter 62, it causes the noise-shaping loop to produce a new quantized output. Because the digital output provided by the noise-shaping loop 68 has an amplitude noise-shaped characteristic, the clock signal produced by the programmable clock divider on line 65 will have a time noise-shaped characteristic. In other words, the timing of the clock signal produced on line 65 will vary, as does the amplitude of a magnitude noise-shaped signal, but the average frequency of such signal will be constant. Such a distinction is explained in more detail below.

Figure 6:
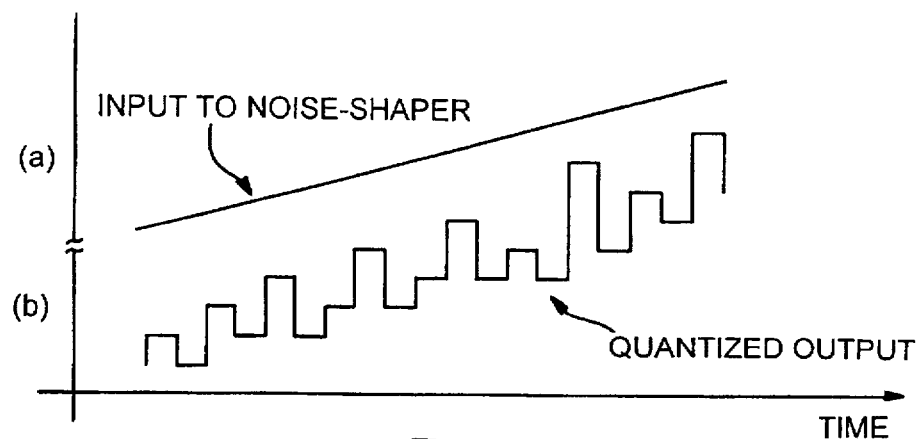
FIG. 6 is a diagram illustrating the input to, and output from, a conventional multi-bit amplitude noise-shaping circuit, such as the one shown in FIG. 4.

FIG. 6 is a diagram illustrating both the input to a conventional multi-bit amplitude noise-shaping circuit (such as the one shown in FIG. 4) and the quantized output produced by such a circuit. Both the input signal, shown at (a), and the output signal, shown at (b), are shown with respect to time (on the horizontal axis). The physical placement of the input above the output in FIG. 6 simply is for illustrative convenience and does not imply that one achieves a different amplitude than the other.

The input is shown as a ramp signal which is applied to the input of a conventional noise-shaping loop. The quantized output is shown with steps of different amplitudes but which, on average, increase. The amplitudes of the different steps have a noise-shaped characteristic.

Figure 7:
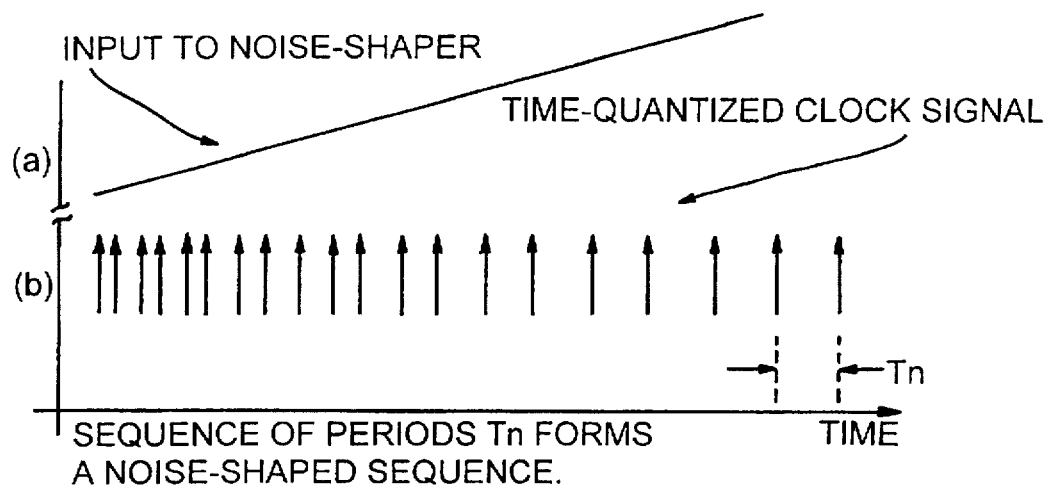
FIG. 7 is a diagram illustrating the input to, and time-quantized clock signal output from, a multi-bit noise-shaped clock signal generator circuit according to the present invention, such as the one shown in FIG. 5.

FIG. 7 illustrates the input to the noise-shaped clock signal generator of the present invention (such as the illustrative one shown in FIG. 5) and the time-quantized (noised-shaped) output clock signal produced by the circuit. Both the input signal, shown at (a), and the output clock signal, shown at (b), are shown versus time (on the horizontal axis).

The input signal to the noise-shaped clock signal generator circuit also is a ramp signal. As explained above, the quantizer output determines the time duration of the output clock signal. For example, a quantizer output of 3 will cause the loop to wait for three master clock pulses before the loop again is clocked. It should be understood that the quantizer must not be allowed to produce a "zero" code, as this would require that a new pulse be produced at the same time as a present pulse.

The output clock signal of the programmable clock divider is a clock signal that is "noise-shaped" in the sense that the Fourier transform of the series of numbers representing the interval $T_n$ between the clock pulses would illustrate the classic amplitude high-pass noise-shaped characteristic of typical noise-shaping loops. In other words, the durations of the intervals between clock pulses would match that of the amplitudes of the noise-shaped quantized output of a typical noise-shaping loop. A noise-shaped clock signal is simply a noise-shaped signal where the noise-shaping occurs in the time domain rather than in the amplitude domain. A typical amplitude noise-shaping loop produces a series of regularly spaced pulses, the amplitudes of which characterize a noise-shaped sequence (see FIG. 6). A noise-shaping clock signal generator circuit, by contrast, produces clock pulses wherein the durations of the intervals between such clock pulses characterize a noise-shaped sequence (see FIG. 7).

As will be explained in greater detail below, in the digital noise-shaping system of the present invention, a noise-shaped clock signal is used to clock either an interpolation filter, in one embodiment, or a decimation filter, in another embodiment. As will be explained in greater detail below, either continuously variable rate interpolation or continuously variable rate decimation is performed. There is no restriction on the type of noise-shaping loop that can be used with the system of the present invention to produce the noise-shaped clock signal. Because the noise-shaping loop is a purely discrete time loop, however, the values of the state variables in the loop filters are dependent only on previous states and not on when the clock signal occurs. This is true of any discrete time system, whether analog or digital. For example, in this regard, a switched-capacitor analog circuit will behave similarly to a purely digital noise-shaping circuit. As should be understood, the same is not true of a continuous-time sigma-delta system, in which state variables are dependent both on the previous state of the variables as well as on the clock period.

If the input to the noise-shaped clock signal generating circuit is a DC signal, and the output is the noise-shaped clock signal, then the loop acts as a digitally-controlled oscillator ("DCO"). Thus, when the input signal resembles a DC signal (which is typical), then the circuit shown in FIG. 5 can be considered as a noise-shaped DCO. A given DC input signal will produce an "average" pulse interval that is directly proportional to the input signal. A noise-shaped DCO differs from other DCO designs in that the noise-shaping attempts to converge on the desired average period over the shortest possible interval. It has been shown that if the DCO was designed employing a second-order noise-shaping filter, then the sequence of differences between the absolute pulse times of the DCO output and the ideal times of a non-time-quantized (non-noise-shaped) clock will be a first-order noise-shaping sequence. Such a result indicates that there is no accumulation of time errors between the DCO clock and the ideal clock because an "early" clock signal arrival is quickly followed by a "late" clock signal arrival. Such a result is especially true for higher order systems.

Figure 8:
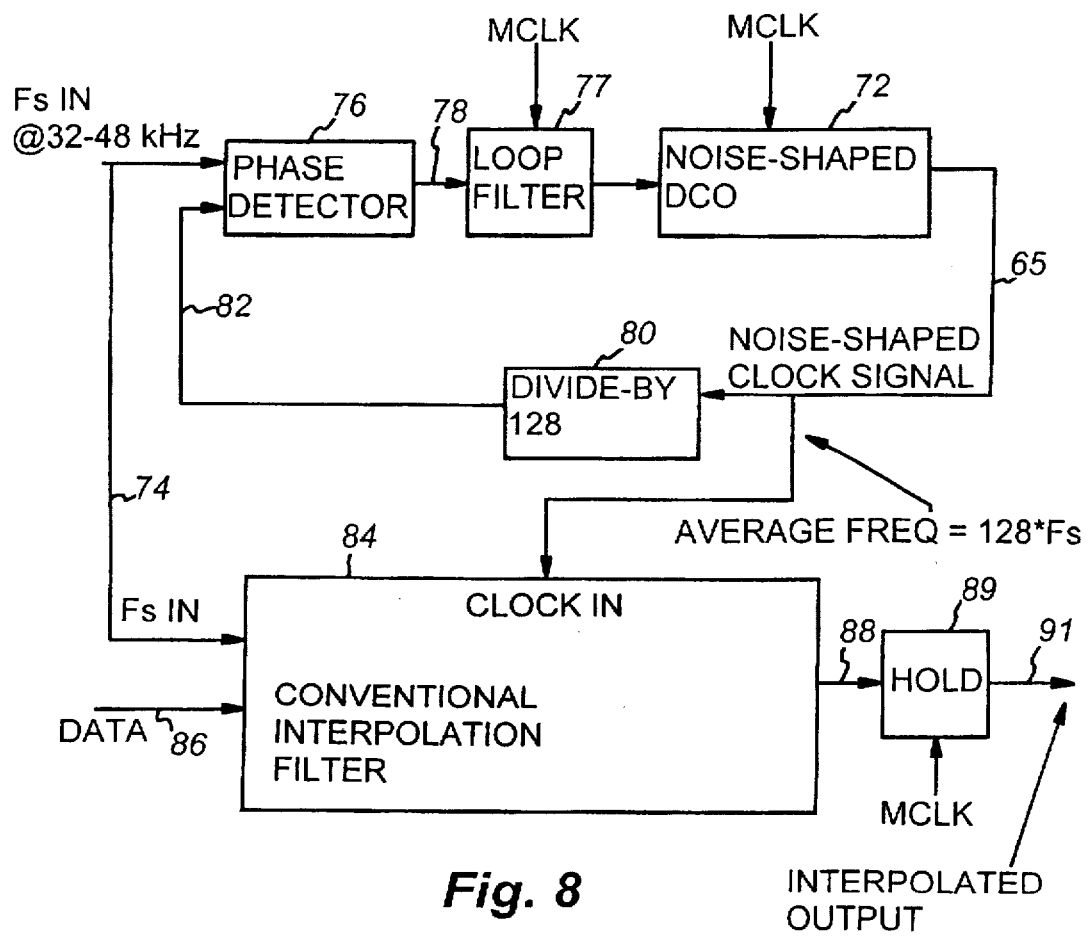
FIG. 8 is a block diagram of a continuously variable rate digital interpolation system according to the present invention.

FIG. 8 is a block diagram of a variable rate interpolation filter system according to the present invention. The system includes an interpolation filter 84 clocked by a noise-shaped clock signal received on line 65. The noise-shaped clock signal is produced by a noise-shaped clock signal generating circuit comprising a PLL that includes a noise-shaped DCO 72. The noise-shaped DCO 72 can itself comprise a noised-shaped clock signal generating circuit such as the one shown in FIG. 5. The PLL includes a phase detector 76, a loop filter 77, a noise-shaped DCO 72 and a divider 80. All elements are digital. The phase detector 76 receives an input clock signal having an input sample rate $F_s$ which typically falls within the range of 32–48 kHz for common video and audio applications. Also received by the phase detector 76 is a feedback signal on line 82.

Phase detector 76 provides an input clock signal on bus 78 to loop filter 77 which filters the signal to provide a smooth input to the noise-shaped DCO 72. The DCO 72, clocked by master clock signal $M_{clk}$, in turn, produces a noise-shaped clock signal on line 65, as explained above with reference to FIG. 5. The noise-shaped clock signal is provided on line 65 to clock the interpolation filter 84 and on the feedback loop to the divider element 80 (shown as a divide-by-128 element in this illustrative example). Divider 80 conventionally reduces the rate (by 128 in this example) of the noise-shaped clock signal and produces a reduced-rate feedback signal on line 82.

The PLL, by operating as described above, locks to a binary multiple (128 times for example) of the input sample rate $F_s$, and provides a noise-shaped clock signal that has an average frequency equal to the binary multiple of the input sample rate $F_s$. This application is analogous to the use of an analog PLL to generate a high-frequency clock signal for a conventional interpolation filter, except that the circuitry of the present invention shown in FIG. 8 is purely digital and therefore can be built into the interpolator 84. The PLL loop operates slowly enough so that the control signal applied to the DCO essentially is DC for a fixed-frequency input sample rate.

Interpolation filter 84 may be a conventional interpolation filter that receives the input sample rate clock signal on line 74 as well as input samples on bus 86 and produces interpolated output samples on bus 88. The output samples of the interpolation filter are provided to hold element 89 which repeats each current value of the output sample at the master clock rate and provides output samples on bus 91. Alternatively, the output of the interpolator could have zeros inserted between samples at the master clock rate. Thus, a variable input rate has been converted to a fixed master clock rate, thereby accomplishing continuously variable interpolation. The output samples of the interpolation filter, clocked with the noise-shaped clock signal, have exactly the same magnitude as the output samples of the interpolator clocked with a non-noise-shaped clock signal except the output is produced at different and varying time points. The output sequence must be considered to be a discrete-time sequence at the full master clock rate $M_{clk}$, even though the data changes only when the noise-shaped DCO produces a clock pulse. This is so because the DCO operates from the master clock signal and is a synchronous digital circuit. Thus, it only produces pulses that are synchronized to the master clock.

Figure 9:
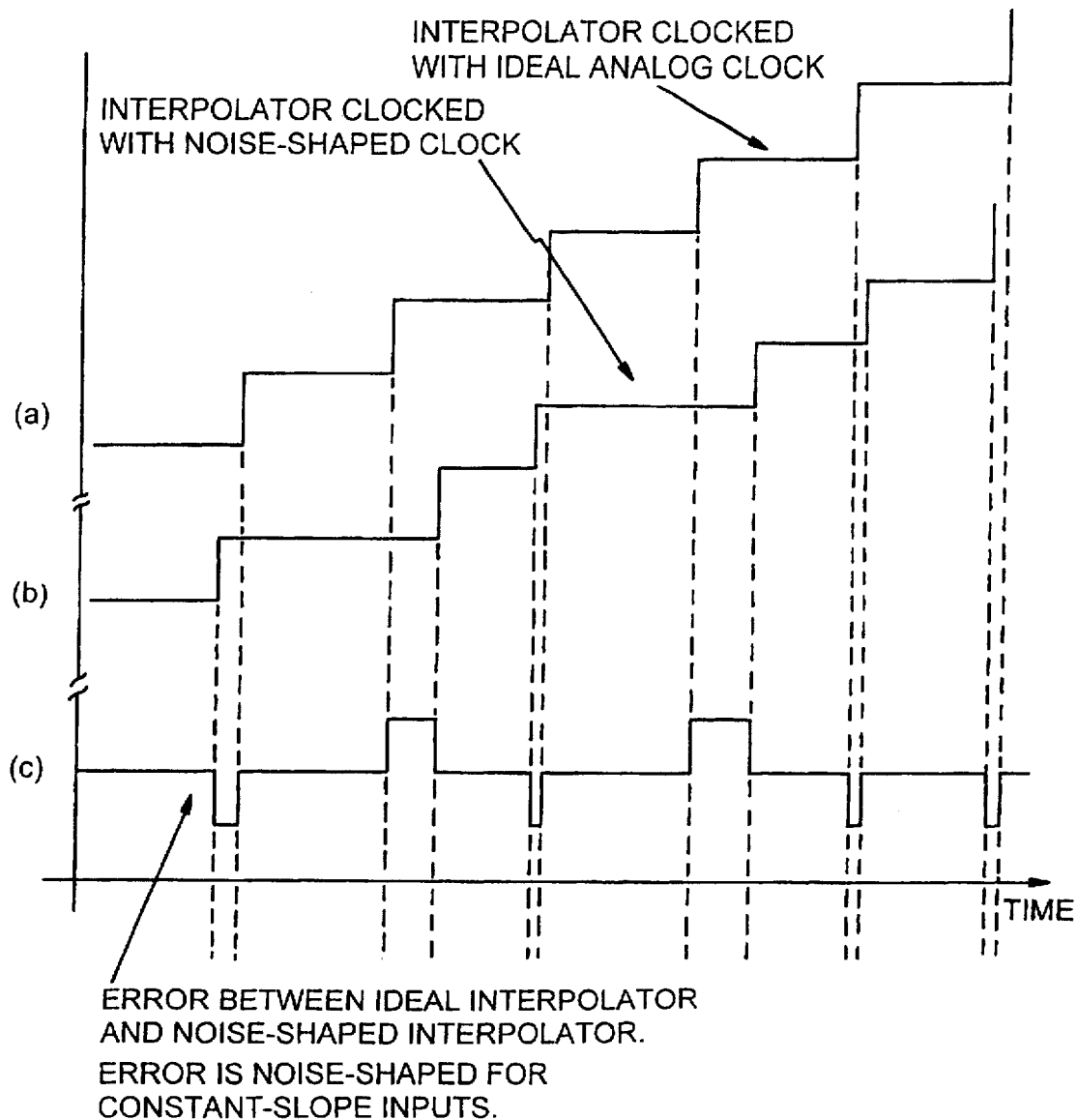
FIG. 9 is a diagram illustrating the relationship between the output of an interpolator clocked with an ideal analog clock signal and the output of an interpolator clocked with a noise-shaped clock signal.

FIG. 9 is a diagram showing (a) the output of the interpolator clocked with an ideal analog clock, (b) the output of the interpolator clocked with a noise-shaped clock and (c) an error pulse signal, with each pulse having an area representing the difference (error) between the two outputs. The noise-shaped clock signal used to clock the interpolator has an average frequency equal to that of the ideal analog clock signal. The error waveform shown in FIG. 9(c) illustrates that the error pulses have a width determined by the time difference between the ideal clock (the analog clock) and the DCO clock (the noise-shaped clock) and the pulse height is determined by the amplitude difference between consecutive samples. It previously was mentioned that the sequence of time differences between a DCO noise-shaped clock signal and an ideal analog clock signal, having the same average frequency, represented a noise-shaped sequence with an order that was one less than the order of the noise-shaping used in the DCO. Because the error pulses have a width proportional to the time difference, then for an interpolated signal with a constant slope, the sequence of error pulse areas represents a noise-shaped sequence with an order of one less than the order of the DCO noise-shaping. Because the signal slope determines the height of the error pulse, the magnitude of the error varies in direct proportion to the signal slope.

To simplify such an analysis, it can be assumed that in a highly oversampled system, it only is the pulse area that is of concern when computing the baseband noise spectrum. The fact that the area is modulated by edge position rather than pulse height can be ignored. In practice, as will be understood, this assumption is valid for the baseband region, assuming a sufficiently high oversampling ratio.

The assumption made in such an analysis is that the signal slope is constant and such an assumption may not be true. For a highly interpolated signal (e.g., 128 times), the signal slope varies quite slowly and this slow modulation of the error pulse height will cause the baseband noise to slightly increase. The worst-case signal for an audio application would be a full-scale signal at the cut-off frequency of the interpolator (typically slightly above 20 kHz). The signal quality for a worst-case input signal can be determined by using discrete-time simulation.

Applicants have performed a discrete-time analysis of the output signal from the variable rate interpolation system of the present invention. In performing such a discrete-time analysis, the output signal must be considered to be a sampled data signal at the full master clock rate, as explained above. When the DCO clock "fires", a new output data value is generated, and this value is repeated on successive ticks of the master clock $M_{clk}$ until a new DCO clock event occurs. If the values between such clock events are zero-filled instead of held, then the gain of the interpolator varies according to the DCO frequency, which is undesirable from a practical standpoint. Thus, it is preferred to hold the value of the DCO clock between ticks. In other words, it is preferable to repeat the values of the interpolated output samples at the master clock rate, which is performed by the hold circuit. If, alternatively, the interpolated output samples are zero-filled instead of held, continuously variable rate interpolation still is accomplished.

Figure 10:
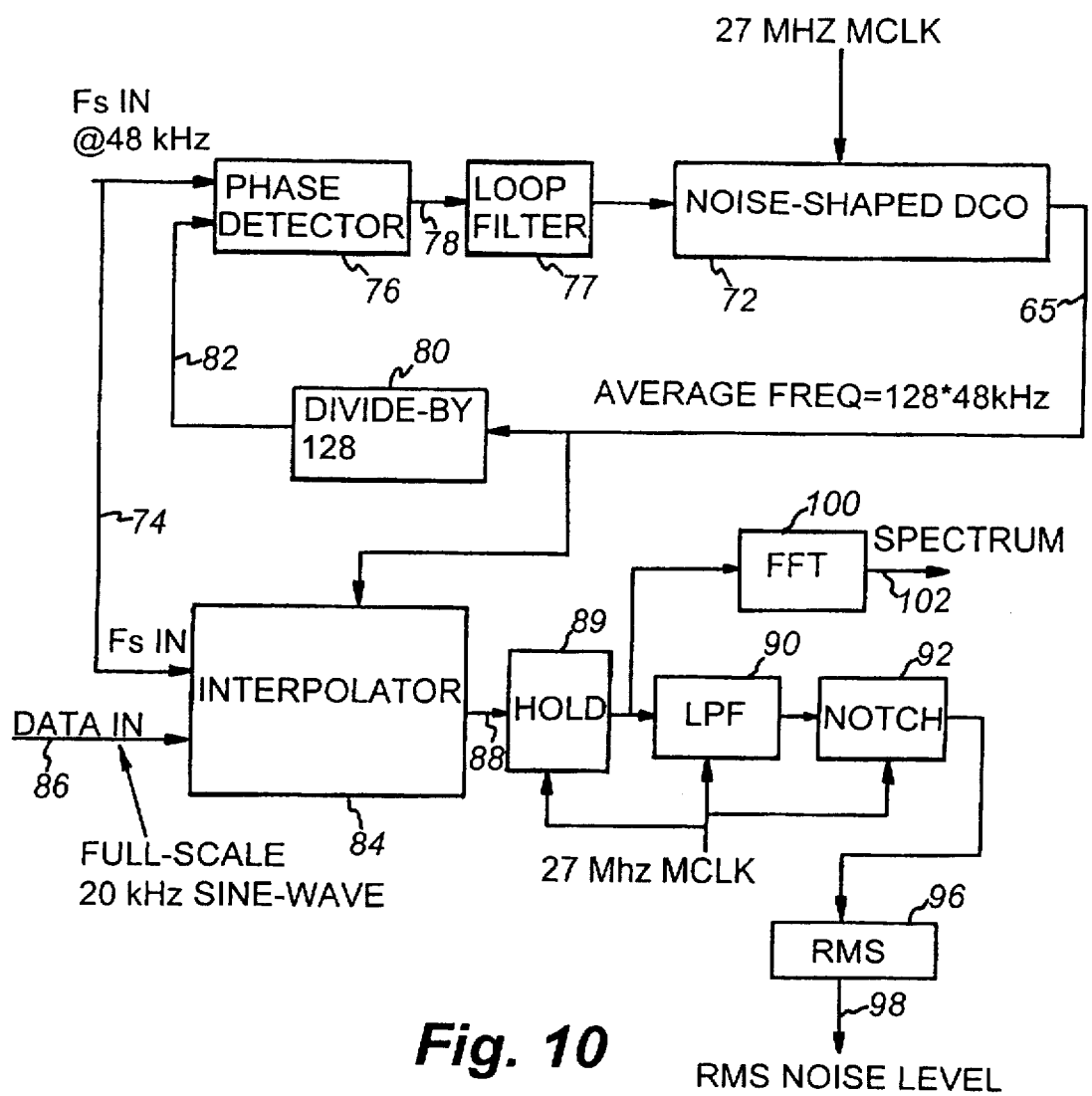
FIG. 10 is a block diagram of a continuously variable rate interpolation system used for simulation.

FIG. 10 is a block diagram of the system used by applicants to simulate operation of the continuously variable rate interpolation system of the present invention. As shown, the variable rate interpolation system is identical to that shown and described with reference to FIG. 8. The output 91 of the interpolator is provided to fast Fourier transform ("FFT") block 100, which provides a spectrum output at line 102. The output of the interpolator also is provided to a circuit including a low-pass filter 90, notch filter 92 and root mean square ("RMS") signal generating circuit 96. Both the low-pass filter 90 and notch filter 92 are clocked by the master clock signal $M_{clk}$. The output of the interpolator 88 is provided to the low-pass filter and then to the notch filter. The filtered output signal is provided along bus 94 to the RMS signal generating circuit 96 which provides an RMS noise level of the output on line 98.

The simulation performed included the following parameters.

1) Master clock rate $M_{clk}$ =27 MHZ.
2) Average noise-shaped clock signal (for clocking the interpolator) =128×48 kHz.
3) Input signal rate=20 kHz (worst-case).
4) Output type=repeat samples.
5) DCO quantizer is dithered to prevent idle tones.

Figure 11A:
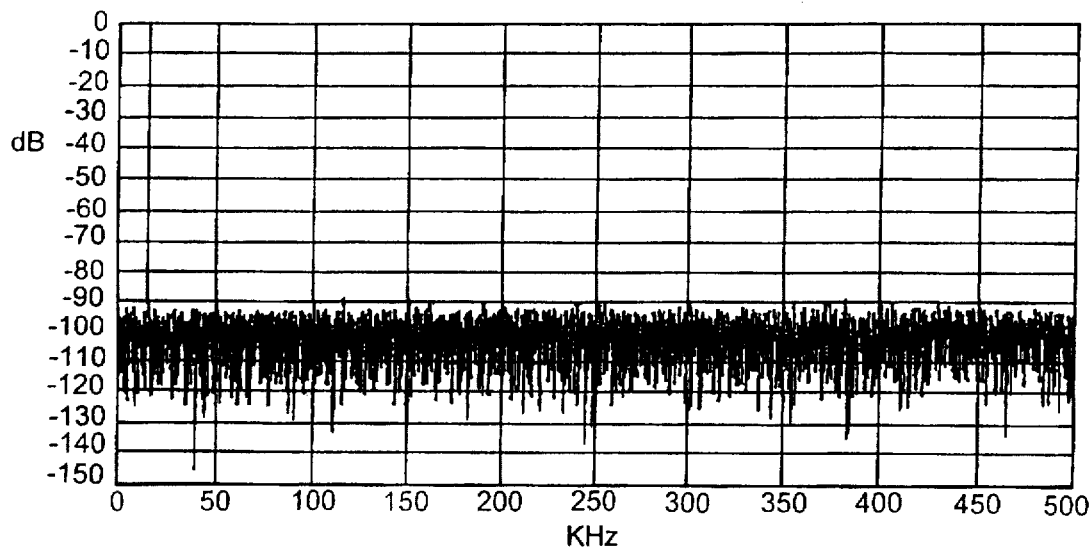
FIGS. 11a and 11b respectively illustrate the spectrum output of a continuously variable rate interpolator clocked by a first-order noise-shaped DCO and spectrum output of a continuously variable rate interpolator clocked by a second-order noise-shaped DCO.
Figure 11B:
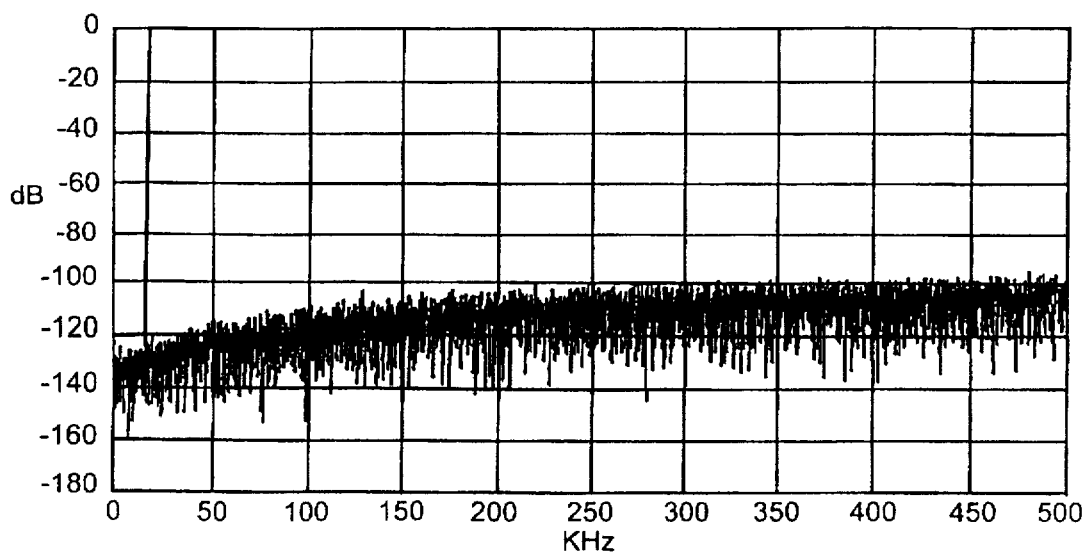

FIGS. 11a and 11b respectively illustrate the resulting simulation output spectra of the interpolator clocked by a first order DCO and a second-order DCO. The output spectra are shown in graph form with the horizontal axis in frequency of KHz and the vertical axis representing the RMS value in dB. The interpolator output spectrum using the first-order DCO (shown in FIG. 11a) illustrates a white-noise characteristic while that of the second-order DCO (shown in FIG. 11b) illustrates a first-order high-pass noise spectrum. This result confirms that the noise-shaping order of the error spectrum is one less than the noise-shaping order used in the DCO.

The low-pass filter 90 and the notch-filter 92 remove high frequency components and the 20 kHz fundamental of the sine-wave output of the interpolator 84. The RMS value of the resulting filtered signal is provided by the RMS circuit 96. The RMS noise level produced by the first-order DCO noise-shaping interpolator circuit is −81 dB. The RMS value produced by the second-order DCO noise-shaping interpolator circuit is −112 dB. Thus, the use of the second-order DCO noise shaper provides dramatically improved interpolator performance.

In a typical oversampled sigma-delta DAC system, the interpolator is followed by a digital sigma-delta modulator, then by a DAC, and then by a switched-capacitor analog filter. Since the interpolator output must be considered to be a discrete-time signal at the full master clock rate (in this illustrative example, 27 MHZ), the modulator and the analog switched-capacitor filter must operate at that master clock rate, which is a much higher rate than that used in a typical circuit and which would require design modifications to a typical analog switched-capacitor filter to enable such operation.

Figure 12:
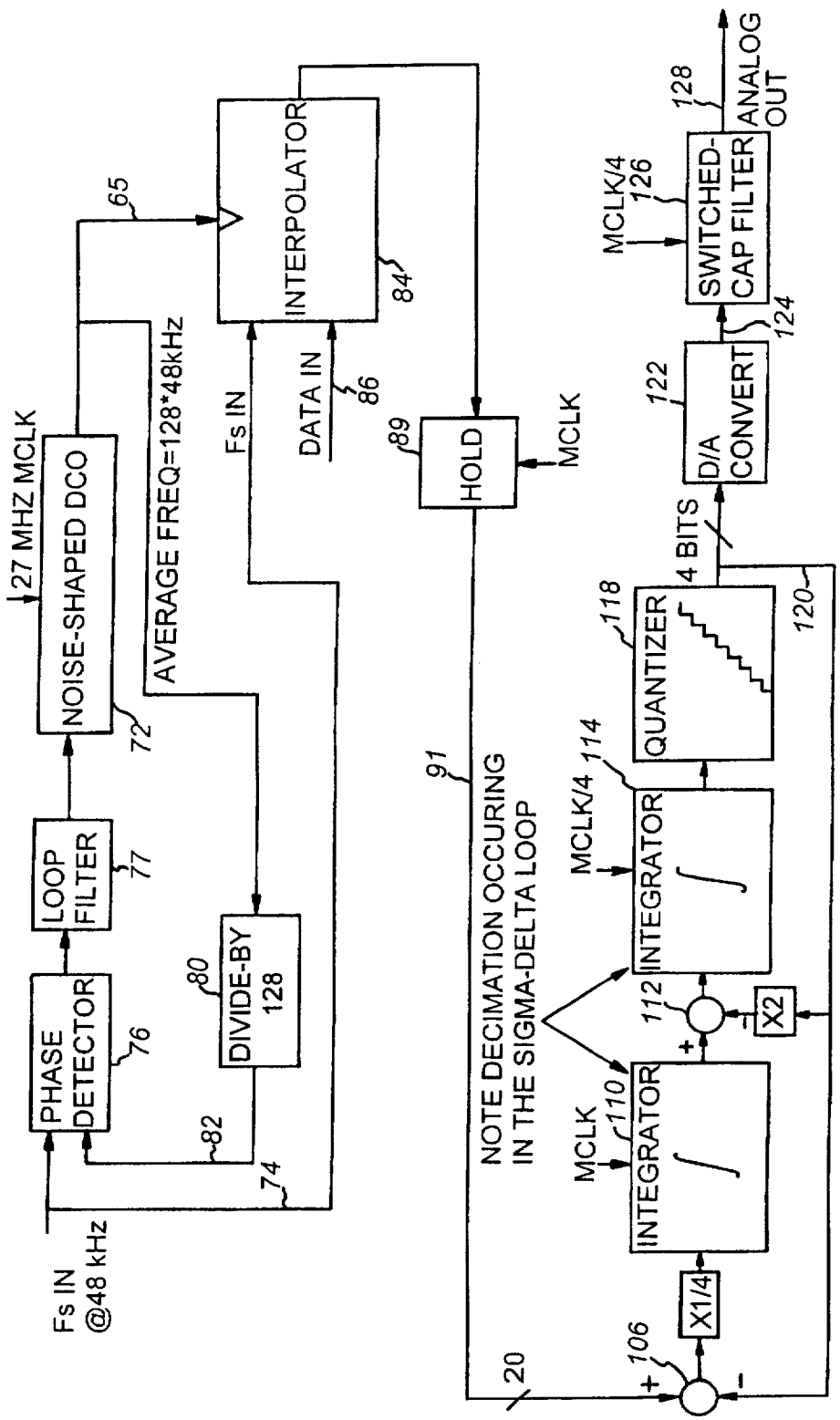
FIG. 12 is a block diagram of an oversampling digital noise-shaping DAC system including a continuously variable rate interpolator and a fixed rate digital noise-shaper according to the present invention.

To more conveniently operate the switched-capacitor filter at a lesser, more typical rate, the circuit of the present invention, shown in FIG. 12, can be used. The sigma-delta DAC system shown in FIG. 12 employs variable rate interpolation and, in order to operate the analog switched-capacitor filter at the lesser, more typical rate, performs decimation while integrating in the second stage of a second-order sigma-delta modulator. The system of FIG. 12 includes the variable rate interpolator 84 clocked by the noise-shaped clock signal received on line 65 from the PLL. The output of the interpolator is repeated at the master clock rate (by the hold circuit) and then is provided on bus 91 to the sigma-delta digital noise-shaper (modulator) 104. The output of the sigma-delta modulator 104 is provided to DAC 122 which converts the noise-shaped quantized samples to an analog signal. The analog signal is provided on line 124 to switched-capacitor filter 126 which reduces unwanted higher frequency noise components and provides a filtered analog output signal on line 128.

The sigma-delta modulator 104 includes a first integrator 110, a second integrator 114, and a quantizer 118. As shown, the first integrator 110 is clocked by the master clock signal $M_{clk}$. The second integrator 114 is clocked at a reduced sub-multiple of the master clock signal, in this illustrative embodiment $M_{clk}/4$. The sigma-delta modulator 104 otherwise is conventional and includes a feedback bus 120 in which the quantized output is provided to summer 106 and then to a coefficient multiplier (×¼) before first integrator 110 and also through a coefficient multiplier (×2) to summer 112 before second integrator 114. In this illustrative embodiment, the interpolator output digital signal on line 88 is a twenty-bit signal and the quantizer output digital signal on line 120 is a four-bit signal.

The first integrator 110 receives the difference between the quantized output of the noise-shaping loop on bus 120 and the output of the DCO-clocked interpolator on bus 88. Because the DCO-clocked interpolator may change on any given master clock cycle, the first integrator must be clocked with the full master clock rate to faithfully integrate the error signal. The output of the first integrator 110 then is decimated by a reduced sub-multiple of the master clock rate by simply clocking the second integrator 114 at the reduced sub-multiple of the master clock (in this example, $M_{clk}/4$).

If the master clock is considered to be 27 MHZ, then one fourth of that master clock (in this illustrative example) is 6.75 MHZ. In this example, thus, the second integrator 114 is clocked at 6.75 MHZ. The decimation during integration allows the analog switched-capacitor filter 126 to run at this reduced rate. Thus, the switched-capacitor filter also is clocked at the reduced sub-multiple of the master clock signal.

The errors caused by the decimation (performed by clocking the second integrator 114 at the reduced rate) are noise-shaped due to the fact that the errors occur within the noise-shaping loop. These errors are noise-shaped by a factor proportional to the gain of the first integrator 110, which is large at low frequencies. As will be understood, quantization errors (caused by quantizer 118) are shaped both by the first and second integrators in the conventional manner, and the errors caused by decimation are shaped only by the first integrator. Thus, quantization errors are second-order noise-shaped and decimation errors are first-order noise-shaped, in this example where a second-order sigma-delta modulator is employed. While a second-order sigma-delta modulator is shown and described, higher-order modulators also could be used. A higher-order modulator would provide higher-order noise-shaping of the decimation error (and quantization noise). As is conventional, when the errors are noise-shaped, their spectrum is shifted to a higher frequency range and then can be reduced by low-pass filtering downstream (such as the switched-capacitor analog filter).

As an alternative to variable rate interpolation, the present invention also contemplates variable rate decimation in an oversampling noise-shaping DAC system. A circuit for performing variable rate decimation is shown in block diagram form in FIG. 13. The system includes a noise-shaped clock signal generating PLL circuit, similar to the one described with respect to the variable rate interpolation system of FIG. 8. The PLL includes a noise-shaped DCO 72, a loop filter 130, and a phase detector 76 as well as a feedback loop including a divide-by-128 element 80. The noise-shaped DCO 72 and loop filter 130 are clocked by the master clock signal $M_{clk}$, in this illustrative example, 27 MHZ.

The input to the decimation filter 132 is assumed to be oversampled and strictly band-limited wherein high-frequency information well-above the audio band would cause performance degradation. This input signal is shown as being provided by a signal source element 140 at the master clock rate of 27 MHZ.

The master clock rate is assumed to be higher than the rate for which the decimation filter is designed. In this example, that rate is 27 MHZ, which master clock signal is available in set-top boxes, being decoded from an incoming MPEG audio/video stream. In this example, the decimator is designed to operate at an input rate of 128 times the final output rate, or about 6.144 MHZ for a 48 kHz output rate.

The noise-shaped clock signal generating PLL, employing the noise-shaped DCO, in this example, locks to 128 times the output word rate (of 48 kHz), and the noise-shaped clock signal is provided on line 65 to clock the decimation filter 132 and also to control the rate by which input samples are latched into the decimation filter.

The noise-shaped clock signal has an average frequency of 6.144 MHZ in this example. The decimation filter operates at the variable rate of the noise-shaped clock signal. The noise-shaped clock signal is used to resample the 27 MHZ input signal down to the 6.144 MHZ average rate by latching in the oversampled input signal at a rate controlled by the noise-shaped clock signal, thus accomplishing continuously variable decimation. The entire system is synchronous with the 27 MHZ master clock, so the resampling process of decimation simply operates on a current input sample that exists when the DCO "fires" and applies that current sample to the decimation filter. The fact that the noise-shaped clock signal that drives the decimation filter is jittered does not effect the result; the filter simply performs a mathematical operation (i.e., by a finite impulse response ("FIR") filter) on the input samples to produce output samples.

This process of variable decimation is different from the variable interpolation, described above, in that the digital data presented to the decimator is dependent upon decisions made in the noise-shaped DCO, but once the number is selected, the timing is unimportant; the decimated output samples are determined completely by the input samples to the decimation filter, and the decimated data is unaffected by the timing of when the input data is delivered. The converse is true for interpolation; the data is unaffected by the timing of the DCO clock, but the timing of when the data is presented to the output is very important and is, in fact, responsible for the noise-shaping characteristic of the final output spectrum.

Applicants have analyzed the output spectrum of the variable decimation system. The analysis similarly uses the concept of a series of time errors between a hypothetical perfect non-time-quantized clock and the noise-shaped DCO clock, described above. The spectrum of the time difference numbers is the integral of the noise-shaping spectrum of the time intervals in the noise-shaped clock. Therefore, the time-difference numbers exhibit a noise-shaping characteristic that is one degree less than that used in the DCO noise-shaper. For an input signal with a fixed slope, the series of time errors between ideal and noise-shaped DCO clocks can be converted to a series of amplitude errors related to the input slope and width equal to the clock time difference. Such was shown with reference to FIG. 9.

Figure 13:
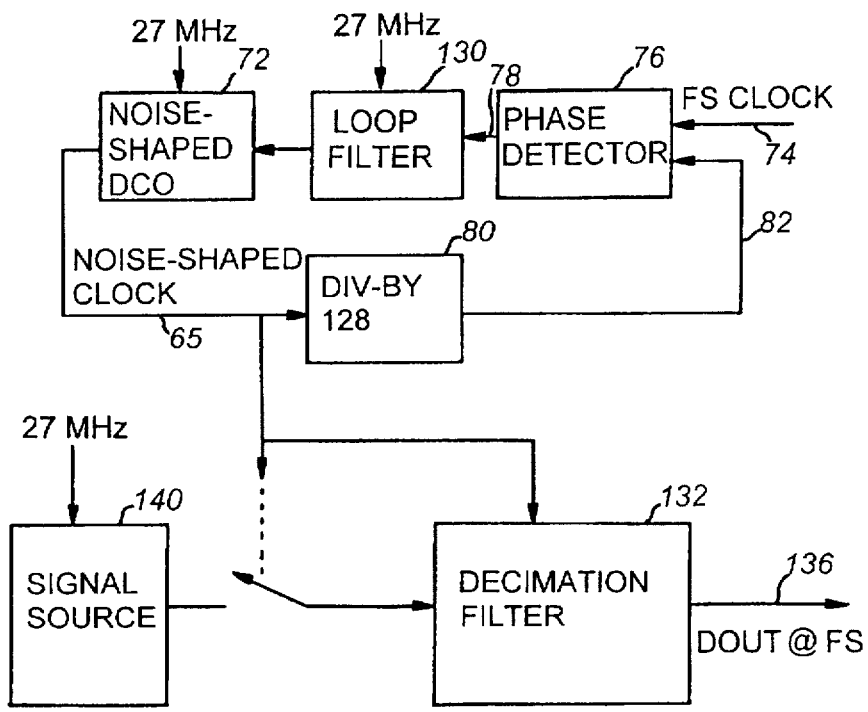
FIG. 13 is a block diagram of a continuously variable rate digital decimation filter according to the present invention.
Figure 14A:
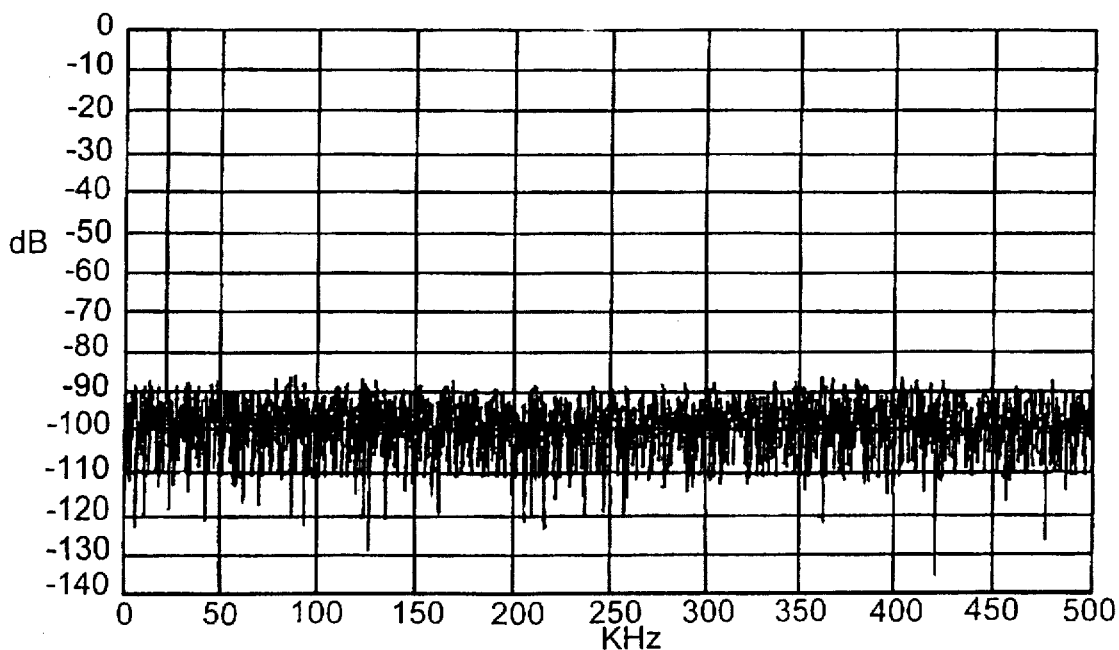
FIGS. 14a and 14b respectively illustrate the decimated output spectrum of the continuously variable rate digital decimation filter clocked by a first-order noise-shaped DCO and the decimated output spectrum of the continuously variable rate decimation filter clocked by a second-order noise-shaped DCO.
Figure 14B:
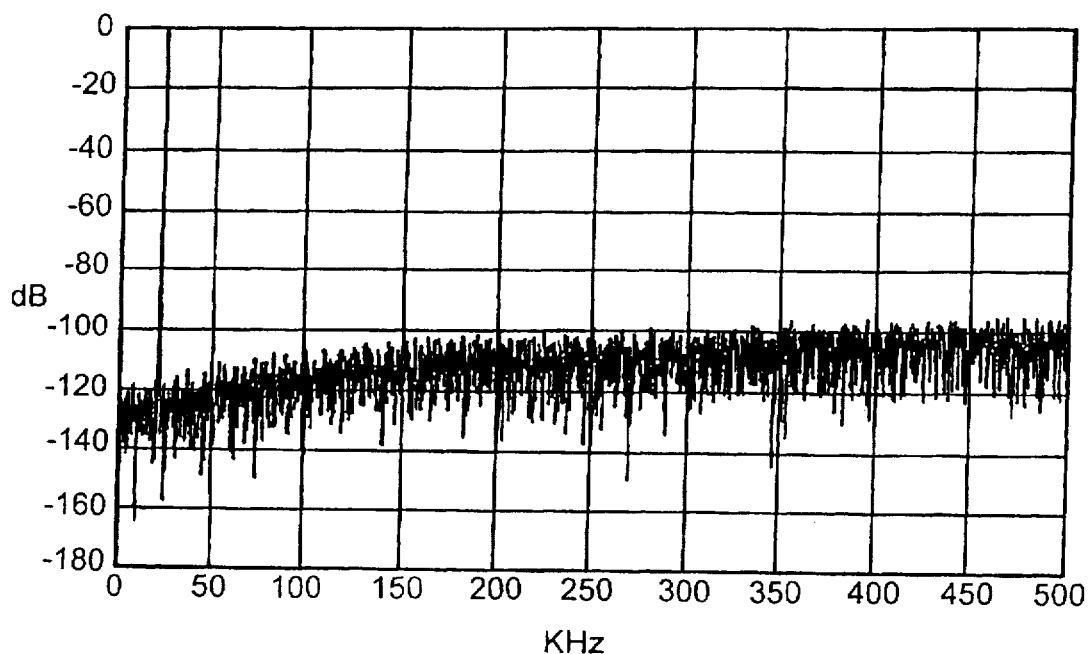

Using a simulation circuit similar to that shown in the block diagram of FIG. 10, but with the variable decimation circuit of the present invention of FIG. 13, decimated output spectra were viewed. FIGS. 14a and 14b respectively show the decimated output spectrum of the system using a first-order noise-shaped DCO and the decimated output spectrum of the system using a second-order noise-shaped DCO. Like the variable interpolation system, the decimated output spectrum using the first-order noise-shaped DCO resembles white noise while the output spectrum using the second-order noise-shaped DCO resembles a first-order high-pass spectrum.

The RMS values of the system using a first-order noise-shaped DCO and a second-order noise-shaped DCO were computed. Using a first-order noise-shaped DCO, the RMS value of the decimated output was −79 dB. Using a second-order noise-shaped DCO, the RMS value of the decimated output was −110 dB. Like the variable interpolation system, dramatic performance improvement is exhibited by using a higher-order noise-shaped DCO in the noise-shaped clock signal generating PLL.

Figure 15:
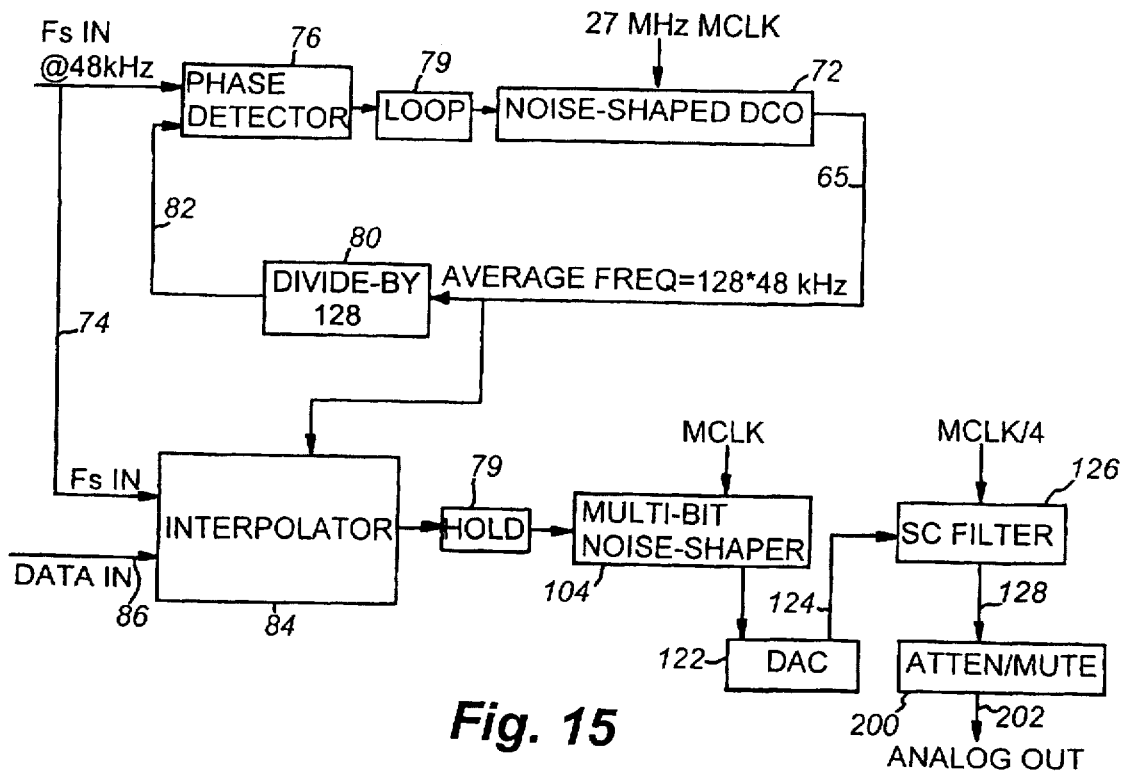
FIG. 15 is a block diagram of an oversampling digital noise-shaping DAC system including a continuously variable rate interpolator, according to the present invention.

FIG. 15 is a block diagram of a variable interpolation sigma-delta DAC system of the present invention employed in an integrated circuit chip. The chip is designed in CMOS technology. As shown, the system includes a noise-shaped clock signal generating circuit including a PLL and a noise-shaped DCO 72. The noise-shaped clock signal is used to clock interpolator 84 at the variable rate. The output of the interpolator 84 is repeated at the master clock rate and then is fed to a multi-bit noise-shaping sigma-delta modulator 104. The sigma-delta modulator 104 can be a high-order modulator that performs decimation in a downstream integrator. A first integrator is clocked by the master clock $M_{clk}$ and a second integrator is clocked at a reduced sub-multiple of the master clock, in this example the master clock divided by 4. Thus, the switched-capacitor analog filter 126 can be clocked at the same reduced rate. The output of the switched-capacitor filter is provided on line 128 to a conventional attenuator/mute element 200 which can attenuate the analog output signal. The analog output signal then is provided on line 202.

It should be understood that while the invention was explained with reference to specific sample rates, oversampling ratios and clock frequencies of operation, such an explanation was for purposes of illustration only and not to limit the scope of the invention. One skilled in the art will recognize that the present invention is not limited to the specific examples disclosed and more generally can be applied to other circuits and methods having different operating parameters than those disclosed. The invention has applications to DAC systems, ADC systems and sample-rate converter systems.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto

What is claimed is:

1. A digital oversampling noise-shaping system comprising:
    a digital noise-shaped clock signal generating circuit, including a digitally-controlled oscillator DCO operating at a fixed master clock rate, that receives an input clock signal having an input sample rate and produces a noise-shaped clock signal having a variable rate with an average rate equal to a multiple of the input sample rate, wherein the DCO includes a first sigma-delta modulator that operates at a variable rate; and
    an interpolator, coupled to the clock signal generating circuit, that receives digital input samples at an input sample rate and, responsive to the noise-shaped clock signal, upsamples the digital input samples at the variable rate.

2. The digital oversampling noise-shaping system as claimed in claim 1 wherein the clock signal generating circuit includes a digital PLL.

3. The digital oversampling noise-shaping system as claimed in claim 1 wherein the clock signal generating circuit includes a digital PLL.

4. The digital oversampling noise-shaping system as claimed in claim 1 wherein the first sigma-delta modulator provides an output that is fedback rough a divider to clock the first sigma-delta modulator.

5. The digital oversampling noise-shaping system as claimed in claim 1 further including a digital noise-shaping circuit, coupled to the interpolator, that performs digital noise-shaping on the upsampled input samples received from the interpolator.

6. The digital oversampling noise-shaping system as claimed in claim 5 wherein the digital noise-shaping circuit includes a second sigma-delta modulator.

7. The digital oversampling noise-shaping system as claimed in claim 6 wherein the second sigma-delta modulator incudes at least first and second integrators connected in cascade.

8. The digital oversampling noise-shaping system as claimed in claim 7 wherein the first integrator operates at the fixed master clock rate and the second integrator operates at a reduced integer sub-multiple of the fixed master clock rate.

9. A digital oversampling noise-shaping system comprising:
    an interpolator, that receives digital input samples at an input sample rate and, responsive to a noise-shaped clock signal, upsamples the digital input samples at a variable upsampling rate;
    a digital noise-shaped clock signal generating circuit, including a DCO operating at the fixed master clock rate, that receives a digital input clock signal and produces the noise-shaped clock signal having an average rate equal to a multiple of the input sample rate, the DCO including a first sigma-delta modulator that operates at a variable rate; and
    a digital noise-shaping circuit, coupled to the interpolator, that performs digital noise-shaping on the upsampled input samples at a fixed master clock rate.

10. The digital oversampling noise-shaping system as claimed in claim 9 wherein the digital noise-shaping circuit includes a second sigma-delta modulator.

11. The digital oversampling noise-shaping system as claimed in claim 10 wherein the second sigma-delta modulator incudes at least first and second integrators connected in cascade.

12. The digital oversampling noise-shaping system as claimed in claim 11 wherein the first integrator operates at the fixed master clock rate and the second integrator operates at a reduced integer sub-multiple of the fixed master clock rate.

13. The digital oversampling noise-shaping system as claimed in claim 9 wherein the first sigma-delta modulator provides an output that is fedback through a divider to clock the first sigma-delta modulator.

14. A method of upsampling and noise-shaping digital input samples comprising the steps of:
    receiving a digital input clock signal having at an input sample rate;
    producing a noise-shaped clock signal having a variable rate with an average rate equal to a multiple of the input sample rate;
    the step of producing including operating a sigma-delta modulator at a variable rate to produce the noise-shaped clock signal;
    responsive to the noise-shaped clock signal, upsampling the digital input samples at the variable rate; and
    performing digital noise-shaping on the upsampled input samples.

15. The method of upsampling and noise-shaping digital input samples as claimed in claim 13 wherein the step of performing digital noise-shaping includes the step of performing digital noise-shaping at at least one fixed rate.

16. The method of upsampling and noise-shaping digital input samples as claimed in claim 15 wherein the step of performing digital noise-shaping includes a first step of integrating at a fixed rate and a second step of integrating at a reduced multiple of the fixed rate.

17. The method of upsampling and noise-shaping as claimed in claim 14 wherein the step of producing further includes feeding back an output of the sigma-delta modulator through a divider to clock the sigma-delta modulator.

18. A digital decimation system comprising:

a digital noise-shaped clock signal generating circuit, including a DCO operating at a fixed master clock rate, that receives an input clock signal at an output sample rate and produces a noise-shaped clock signal having a variable rate with an average rate equal to a multiple of the output sample rate, wherein the DCO includes a sigma-delta modulator that operates at a variable rate; and a resampler, coupled to the clock signal generating circuit, that resamples oversampled input samples at the variable rate; and a decimator, coupled to the clock signal generating circuit and the resampler, that receives the resampled input samples at the variable rate and produces output samples at a rate that is a fixed sub-multiple of the variable rate.

* * * * *

UNITED STATES PATENT AND TRADEMARK OFFICE

CERTIFICATE OF CORRECTION

PATENT NO. : 5,786,778

DATED : July 28, 1998

INVENTOR(S): Robert W. Adams and Tom W. Kwan

It is certified that error appears in the above-identified patent and that said Letters Patent is hereby corrected as shown below:

IN THE CLAIMS

Column 13, line 63, please replace "rough" with --through--.

Column 14, line 8, please replace "incudes" with --includes--.

Column 14, line 36, please replace "incudes" with --includes--.

Column 14, line 62, please replace "13" with --14--.

Signed and Sealed this

Twenty-third Day of February, 1999

Attest:

Q. TODD DICKINSON

*Attesting Officer*      *Acting Commissioner of Patents and Trademarks*